United States Patent [19]

McMichen et al.

[11] Patent Number: 5,525,063

[45] Date of Patent: Jun. 11, 1996

[54] BACKPLATE WITH SIGNAL BUS

[75] Inventors: Thomas B. McMichen, Sagamore Beach; Herbert J. McEvoy, Jr., North Attleboro, both of Mass.

[73] Assignee: Motorola, Inc., Schaumburg, Ill.

[21] Appl. No.: 533,881

[22] Filed: Sep. 26, 1995

Related U.S. Application Data

[63] Continuation of Ser. No. 122,116, Sep. 16, 1993, abandoned.

[51] Int. Cl.⁶ ............................................. H01R 9/09
[52] U.S. Cl. ................................... 439/61; 439/79
[58] Field of Search .......................... 439/79, 65, 44, 439/45, 46, 48, 78, 61

[56] References Cited

U.S. PATENT DOCUMENTS

| | | | |
|---|---|---|---|
| 4,352,533 | 10/1982 | Murase et al. | 439/79 X |
| 4,418,972 | 12/1983 | Benasuilti | 439/79 OR |
| 5,201,662 | 4/1993 | Roche | 439/79 OR |
| 5,240,422 | 8/1993 | Kobayashi et al. | 439/79 X |
| 5,259,773 | 11/1993 | Champion et al. | 439/79 X |
| 5,282,752 | 2/1994 | Doutrich et al. | 439/79 OR |

*Primary Examiner*—David L. Pirlot
*Assistant Examiner*—Daniel Wittels
*Attorney, Agent, or Firm*—J. Ray Wood

[57] ABSTRACT

A backplane (3101) includes a plurality of connectors (3150, 3250, 3350) mounted on the front (3105), each connector arranged to accept a circuit board (3160, 3260, 3360) having a set of signal receptacles (3140, 3240, 3340). Each connector includes a set of connector holes (3130, 3230, 3330) positioned such that when a circuit board is mounted in the connector the set of connector holes aligns with the set of signal receptacles. Further, the backplane includes a set of backplane holes (3120, 3220, 3320) aligned with the set of connector holes. As a result, when circuit boards are mounted in the connectors, a signal bus (3107) including a plurality of sets of conductive prongs (3110, 3210, 3310) may be affixed to the back (3103) so the prongs extend through the backplane holes and connector holes to make electrical contact with the signal receptacles in the circuit boards.

15 Claims, 4 Drawing Sheets

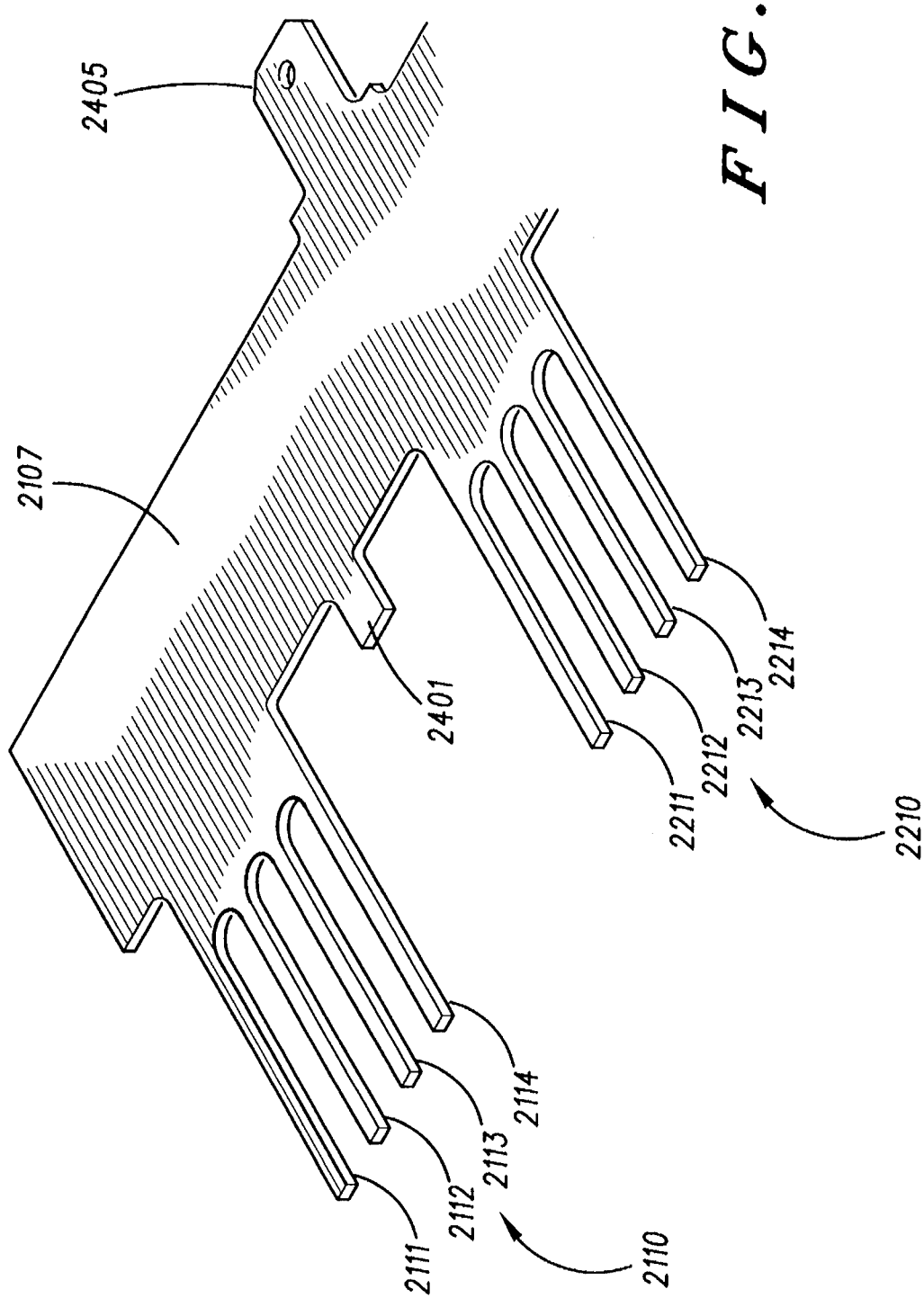

BACKPLATE WITH SIGNAL BUS

This is a continuation of application Ser. No. 08/122,116, filed 09/16/93 and now abandoned.

FIELD OF THE INVENTION

This application relates to backplanes including, but not limited to, a backplanes equipped with signal busses.

BACKGROUND OF THE INVENTION

It is known to mount one or more electrical connectors on a backplane. With such an arrangement, each connector accepts a circuit board having a set of signal receptacles. Each connector typically includes a set of electrical pins (sometimes referred to as "male pins") designed to mate with the electrical receptacles when the circuit board is mounted in the connector. The connector pins are further coupled to a printed wiring board "PWB") mounted on the backplane. The arrangement of signal receptacles, connector pins, and PWB thus cooperate to electrically couple the circuit boards when they are mounted in the connectors.

In the past, such backplane arrangements have used the PWB to distribute power to boards. With this arrangement, the PWB delivered power to a predetermined electrical pin in the connector which, in turn, made contact with the power receptacle when the circuit board was mounted in the connector. As a result of this approach, however, the PWB required heavy copper planes to carry the power, thus increasing the cost of the PWB.

Also as a result of this prior approach, the power layer was forced to be dangerously close to signal layers on some complex PWB layouts, thus creating a risk of electrical short circuits and fire hazards.

Further, the prior approach resulted in a power distribution system that was inefficient. This was because the PWB power layers dissipated a significant amount of power, thus causing substantially reducing the power available to the circuit boards.

Moreover, the prior approach resulted in a power bus that was noisy. This was because the PWB power layers included substantial capacitance and inductance, thus resulting in a high-impedance power bus which, as is known, is inherently noisy at high frequencies.

As a result, there is disclosed a novel arrangement of a backplane with signal bus, which is believed to represent a substantial improvement over the prior art.

BRIEF DESCRIPTION OF THE DRAWINGS

FIG. 4 shows further detail for the signal bus of FIG. 2.

DESCRIPTION OF THE PREFERRED EMBODIMENT

Briefly, in accordance with the present invention, a backplane includes a plurality of connectors mounted on the front, each connector arranged to accept a circuit board having a set of signal receptacles. Each connector includes a set of connector holes positioned such that when a circuit board is mounted in the connector the set of connector holes aligns with the set of signal receptacles. Further, the backplane includes a set of backplane holes aligned with the set of connector holes. As a result, when circuit boards are mounted in the connectors, a signal bus including a plurality of sets of conductive prongs may be affixed to the back so the prongs extend through the backplane holes and connector holes to make electrical contact with the signal receptacles in the circuit boards. In one embodiment, the signal comprises power such as, for example, negative forty-eight volts direct current (–48 volts DC).

Figure 1:
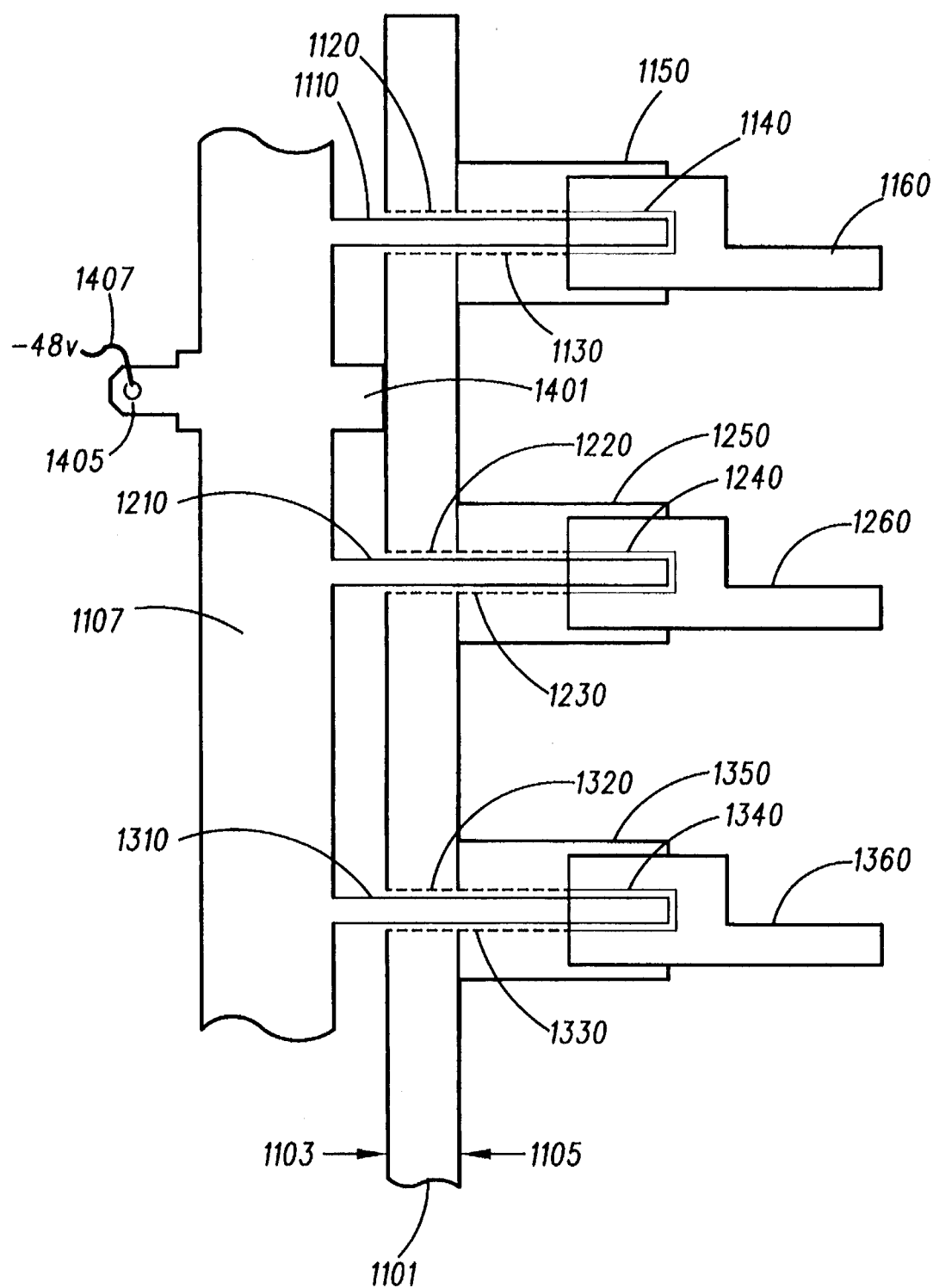
FIG. 1 is a top cross-sectional view of a first embodiment of a backplane with signal bus, in accordance with the present invention.

Referring to FIG. 1, there is shown a top cross-sectional view of a first embodiment of a backplane with signal bus, in accordance with the present invention. There is shown a backplane 1101 having a front 1105 and a back 1101, the backplane having a plurality of connectors 1150, 1250, 1350 affixed to the front, each connector arranged to accept a circuit board 1160, 1260, 1360. As shown, each circuit board includes a signal receptacle, circuit board 1160, 1260, and 1360 including receptacles 1140, 1240, and 1340, respectively.

As shown, each connector includes a connector hole, connector 1150, 1250 and 1350 including connector holes 1130, 1230, and 1330, respectively. The plurality of connectors thus forms a plurality of connector holes, each connector hole positioned such that when a circuit board is mounted in the corresponding connector the connector hole aligns with the signal receptacle.

As shown, the backplane includes a plurality of backplane holes 1120, 1220, and 1320 aligned with the plurality of connector holes 1130, 1230, and 1330. Thus, backplane holes 1120, 1220, and 1320 respectively align with connector holes 1130, 1230, and 1330, thus forming a plurality of pairs of connector holes and corresponding backplane holes.

There is also shown in FIG. 1 a bus 1107 formed of conductive material, the bus being elongated and having a length and affixed to the back of the backplane and including a plurality of prongs 1110, 1210, and 1310 disposed along the length. As shown, each prong is aligned with a corresponding pair of connector holes and corresponding backplane holes. As a result, prong 1110 is aligned with backplane hole 1120 and connector hole 1130; prong 1210 is aligned with backplane hole 1220 and connector hole 1230; and prong 1310 is aligned with backplane hole 1320 and connector hole 1330.

As shown, each prong extends through its corresponding pair of connector holes and corresponding backplane holes to the front of the backplane so that, when a circuit board is mounted in the corresponding connector (as shown), the prong makes electrical contact with the signal receptacle. As a result, prong 1110 makes contact with signal receptacle 1140 of circuit board 1160; prong 1210 makes contact with signal receptacle 1240 of circuit board 1260; and prong 1310 makes contact with signal receptacle 1340 of circuit board 1360.

While FIG. 1 shows the backplane 1101 including at least three connectors 1150, 1250, and 1350, the principles of the present invention are applicable to backplanes having any number of connectors.

As shown, the plurality of connectors 1150, 1250, and 1350 are spaced at fixed equal intervals from each other. In another embodiment, however, the connectors may be spaced at non-equal intervals.

As shown, the bus 1107 includes a mechanical spacer 1401 arranged to maintain a fixed spacing between the backplane and the bus.

As shown, the bus 1107 includes a terminal 1405 for attaching a signal lead 1407 thereto. As shown, the terminal 1405 is coupled to −48 volts DC by the lead 1407. Although FIG. 1 shows the bus 1107 being utilized to couple power to the circuit boards 1160, 1260, and 1360, it will be appreciated that the embodiment of FIG. 1 may be used with other signals as well.

Figure 2:
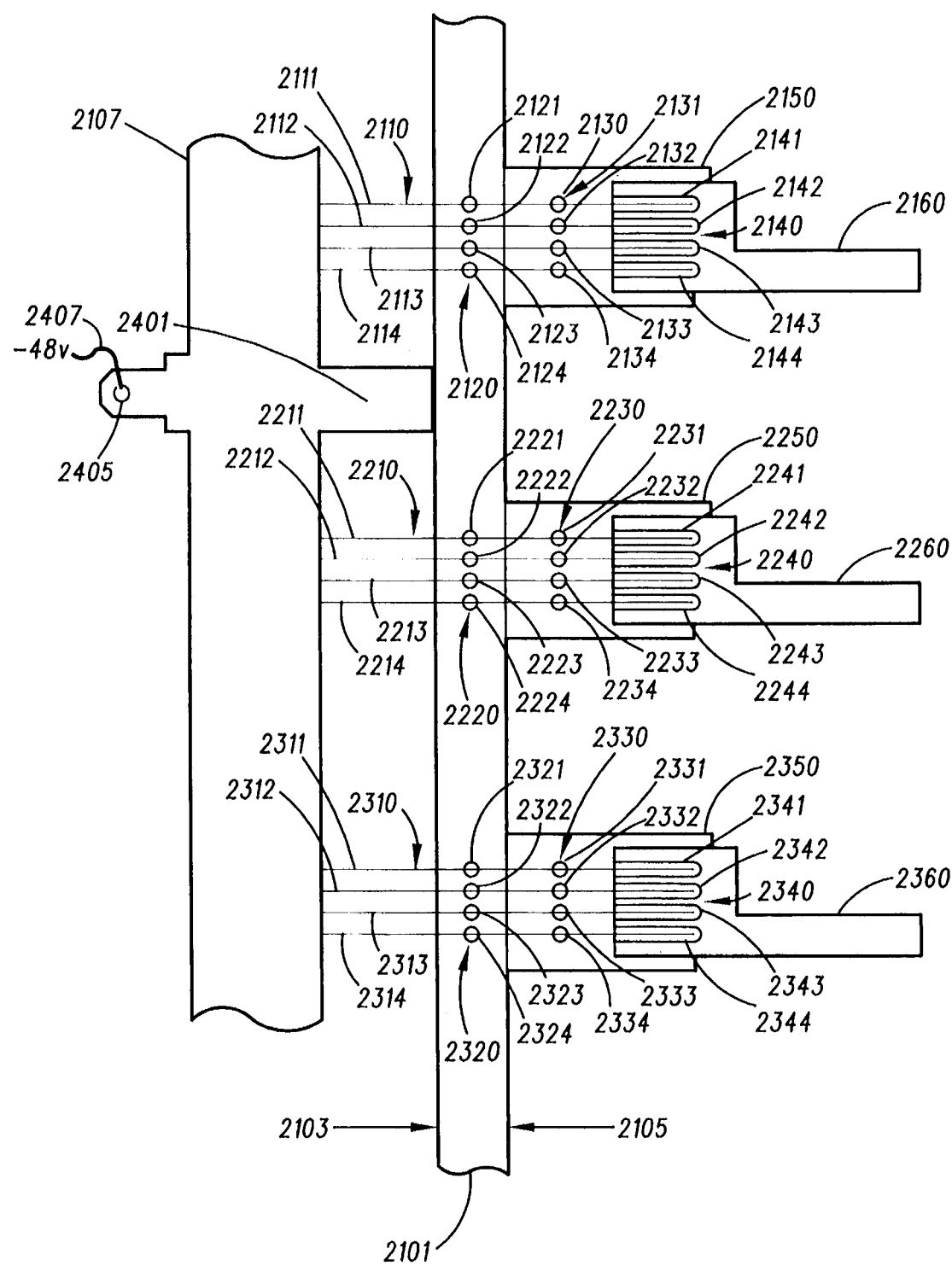
FIG. 2 is a top cross-sectional view of a second embodiment of a backplane with signal bus, in accordance with the present invention.

Referring to FIG. 2, there is shown a cross-sectional view of a second embodiment of a backplane with signal bus, in accordance with the present invention. There is shown a backplane 2101 having a front 2105 and a back 2103, the backplane having a plurality of connectors 2150, 2250, and 2350 affixed to the front, each connector arranged to accept a circuit board. Thus, connector 2150 is arranged to accept circuit board 2160; connector 2250 is arranged to accept circuit board 2260; and connector 2350 is arranged to accept circuit board 2360.

As shown, each circuit board includes a set of signal receptacles. Thus, circuit board 2160 includes a set of four signal receptacles 2141, 2142, 2143, and 2144, the set generally designated as 2140. Likewise, circuit board 2260 includes a set of four signal receptacles 2241, 2242, 2243, and 2244, the set generally designated as 2240. As well, circuit board 2360 includes a set of four signal receptacles 2341, 2342, 2343, and 2344, the set generally designated as 2340.

As shown, each connector includes a set of connector holes, the plurality of connectors thus forming a plurality of sets of connector holes. Thus, connector 2150 includes a set of four connector holes 2131, 2132, 2133, and 2134, the set generally designated as 2130. Also, connector 2250 includes a set of four connector holes 2231, 2232, 2233, and 2234, the set generally designated as 2230. Likewise, connector 2350 includes a set of four connector holes 2331, 2332, 2333, and 2334, the set generally designated as 2330.

As shown, each set of connector holes is positioned such that when a circuit board is mounted in the corresponding connector, the set of connector holes aligns with the set of signal receptacles. Thus, when the circuit board 2160 is seated in the connector 2150, the set of connector holes 2130 aligns with the set of signal receptacles 2140. Likewise, when the circuit board 2260 is seated in the connector 2250, the set of connector holes 2230 aligns with the set of signal receptacles 2240. Also, when the circuit board 2360 is seated in the connector 2350, the set of connector holes 2330 aligns with the set of signal receptacles 2340.

As shown, the backplane includes a plurality of backplane holes, thus forming a plurality of sets of backplane holes. Thus the backplane includes a plurality of backplane holes 2121 through 2124 arranged in a set designated 2120; the backplane includes a plurality of backplane holes 2221 through 2224 arranged in a set designated 220; and the backplane includes a plurality of backplane holes 2321 through 2324 arranged in a set designated 2320. As shown, each set of backplane holes is aligned with a set of connector holes. There is thus formed a plurality of sets of backplane holes and corresponding sets of connector holes. Thus, the set of backplane holes 2120 aligns with and corresponds to the set of connector holes 2130; the set of backplane holes 2220 aligns with and corresponds to the set of connector holes 2230; and the set of backplane holes 2320 aligns with and corresponds to the set of connector holes 2330.

Still referring to FIG. 2, there is shown a bus 2107 formed of conductive material, the bus being elongated and having a length and affixed to the back of the backplane. As shown the bus includes a plurality of sets of prongs disposed along the length. Thus, the bus includes a plurality of prongs 2111 through 2114 arranged in a set designated 2110; the bus includes a plurality of prongs 2211 through 2214 arranged in a set designated 2210; and the bus includes a plurality of prongs 2311 through 2314 arranged in a set designated 2310.

Moreover, each set of prongs is arranged to align with a set of connector holes and corresponding set of backplane holes. As a result, each set of prongs is arranged to extend through its corresponding set of connector holes and backplane holes so that, when a circuit board is mounted in the corresponding connector, the set of prongs makes electrical contact with the set of signal receptacles.

Thus, as shown, the set of prongs 2110 extends through the set of backplane holes 2120 and set of connector holes 2130 of connector 2150 to make contact with the set of signal receptacles 2140 of circuit board 2160. Also, the set of prongs 2210 extends through the set of backplane holes 2220 and set of connector holes 2230 of connector 2250 to make contact with the set of signal receptacles 2240 of circuit board 2260. Likewise, the set of prongs 2310 extends through the set of backplane holes 2320 and set of connector holes 2330 of connector 2350 to make contact with the set of signal receptacles 2340 of circuit board 2360.

While FIG. 2 depicts the backplane 2101 as including three connectors 2150, 2250 and 2350, it will be appreciated that the principles of the invention are applicable to backplanes having any number of connectors.

As shown in FIG. 2, the plurality of connectors are spaced at uniform intervals from each other. In an alternate embodiment, the spacing between the connectors is not uniform.

As shown in FIG. 2, the bus 2107 includes a mechanical spacer 2401 to maintain a fixed spacing between the bus and the backplane.

While the embodiment disclosed in FIG. 2 employed circuit packs each having a set of four signal receptacles, the principles of the present invention are equally applicable to circuit packs having any number of signal receptacles each. For example, each circuit pack may have 1, 2, 3, 4, 5, 6, or more signal receptacles each. If the number of signal receptacles in each circuit pack were varied, however, it will be appreciated that the number of corresponding connector holes, backplane holes, and conductive prongs must also be correspondingly varied as well. For example, still referring to FIG. 2, if each set of signal receptacles 2140, 2240, and 2340 contained a fixed number, say n, of signal receptacles, then each set of connector holes 2130, 2230, and 2330 would have n holes; each set of backplane holes 2120, 2220, and 2320 would have n holes; and each set of conductive prongs 2110, 2210, and 2310 would have n prongs.

In another embodiment, each circuit pack may have a different number of signal receptacles. Still referring to FIG. 2, for example, circuit pack 2160 may have X signal receptacles; circuit pack 2260 may have Y signal receptacles; and circuit pack 2360 may have Z signal receptacles, where X, Y and z are all different, thus X≠Y≠Z. In this case, the set of connector holes 2130 (corresponding to circuit pack 2160) will have X holes, the set of backplane holes 2120 (corresponding to circuit pack 2160) will have X holes, and the set of conductive prongs 2110 (corresponding to circuit pack 2160) will have X prongs. Likewise, the set of connector holes 2230 (corresponding to circuit pack 2260) will have Y holes, the set of backplane holes 2220 (corresponding to circuit pack 2260) will have Y holes, and the set of conductive prongs 2210 (corresponding to circuit pack 2260) will have Y prongs. Also, the set of connector holes 2330 (corresponding to circuit pack 2360) will have Z holes, the set of backplane holes 2320 (corresponding to circuit pack 2360) will have Z holes, and the set of conductive prongs 2310 (corresponding to circuit pack 2360) will have Z prongs.

As shown, the bus 2107 includes a terminal 2405 for attaching a signal lead 2407 thereto. As shown, the lead 2407 is connected to power, namely, –48 volts DC. In another embodiment, the bus is used to deliver another signal to the circuit boards.

Figure 3:
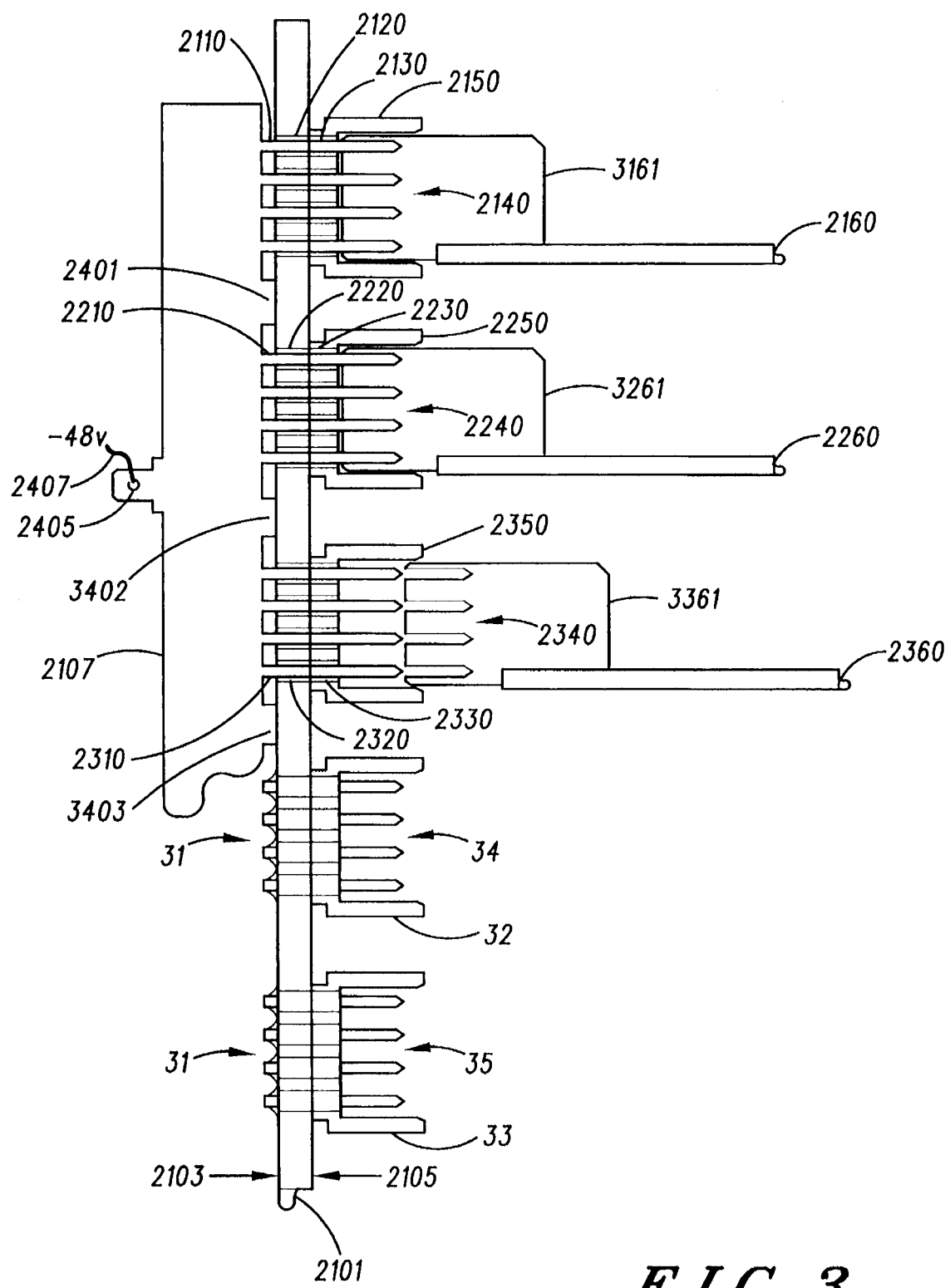
FIG. 3 shows further detail for the backplane and signal bus of FIG. 2.

Referring to FIG. 3, there is shown more detail for the backplane 2101 and the bus 2107. Note the backplane includes PWB wiring 31, a fourth connector 32 and a fifth connector 33. The fourth connector 32 includes a set of connector pins 34 that are coupled to the PWB wiring 32. Likewise, the fifth connector 33 includes a set of connector pins 35 that are coupled to the PWB wiring 31.

Still referring to FIG. 3, the bus 2107 includes a second mechanical spacer 3402, and a third mechanical spacer 3403.

Still referring to FIG. 3, the circuit pack 2160 includes a receptacle assembly 3160; the circuit pack 2260 includes a receptacle assembly 3261; and the circuit pack 2360 includes a receptacle assembly 3361. The receptacle assembly units 3161, 3261, and 3361 are available from Robinson-Nugent as part number HDC-464-421E-005.

Referring to FIG. 4, there is shown more detail for the bus 2107.

While the foregoing embodiments disclose a backplane being equipped with a single signal bus, it will be appreciated that the principles of the present invention are equally applicable to a backplane being equipped with a plurality of signal busses. In an alternate embodiment, for example, the circuit boards may require multiple power feeds. For example, the circuit boards may require a primary power supply of –48 volts DC, and also a secondary or "back-up" power supply of –48 volts DC. In an alternate embodiment, the circuit boards may require a first power supply of +5 volts DC, and also a second power supply of some other voltage level such as, for example, +12 volts DC.

Thus, there is disclosed a method of safely distributing power among cards in a nest, while eliminating interim connectors. This system allows for live plugging nest cards with a single bus across several board slots. It eliminates mechanical alignment problems associated with the use of discrete connectors and mother board mating in a simultaneous blind mating function. It also separates the power distribution scheme from the PWB fabrication. The benefit of this is the simplification of the PWB and avoidance of heavy copper planes to carry the power required. The bus bar also allows for sequential mating within the backplane connector, without the expense of stepped pin connectors.

The disclosed technique works with the high density connector system such as the Thomas & Betts, XD/P Series, which is a two-part connector. The backplane or mother board has the male shrouded header installed, and the daughter boards have the female receptacle installed.

The technique requires locations in the mother board to be left vacant, where the bus is to be utilized. The vacant locations will have a slightly oversized hole to allow for the passage of the conductive prong through the mother board and into the male header.

Once installed, the contacts of the bus bar will function the same as the male pins in the mother board. In the preferred embodiment, however, the conductive prongs on the bus bar will be slightly longer than the signal pins. This provides the "make first/break last" sequence desired for live card insertion.

Some advantages of a backplane with signal bus, in accordance with the present invention, are as follows:

First, the present application of a bus bar reduces the cost of the corresponding PWB by eliminating the need for heavy copper planes necessary to carry power. The backplane connector cost is reduced, because the connector is loaded with a single pin length because the longer pins are an integral part of the bus. This results in reduced costs.

Second, the isolation of the bus from the backplane etched layers results in improved spacing between the power and signal layers. This simplifies the PWB design/routing. This effort often requires strict spacing requirements and can cause re-routing for non-functional reasons, which is eliminated by the isolation. This results in improved safety.

Third, the power transmission to the nest card is improved, because the high current bus is connected directly to the nest card via the backplane connector replaced pins. The traditional method of etch bussing introduces voltage drop and random inductance and capacitance in the power circuit. The result is a more reliable and cleaner power distribution circuit. This results in improved performance.

While various embodiments of a backplane with signal bus, in accordance with the present invention, have been described hereinabove, the scope of the invention is defined by the following claims.

What is claimed is:

1. An arrangement comprising:
    a backplane having a front and a back, the backplane having a plurality of connectors affixed to the front, each connector arranged to accept a circuit board having a signal receptacle, each connector having a connector hole, the plurality of connectors thus forming a plurality of connector holes, each connector hole positioned such that when a circuit board is mounted in the corresponding connector the connector hole aligns with the signal receptacle, the backplane having a plurality of backplane holes aligned with said plurality of connector holes, thus forming a plurality of pairs of connector holes and corresponding backplane holes; and,
    a bus formed of conductive material, the bus being elongated and having a length and affixed to the back of the backplane and including a plurality of one piece prongs with the bus disposed along the length, each prong aligned with a corresponding pair of connector holes and corresponding backplane holes and extending therethrough to the front so that, when a circuit board is mounted in the corresponding connector, the prong makes electrical contact with the signal receptacle.

2. The arrangement of claim 1, the backplane including at least three connectors.

3. The arrangement of claim 2, the plurality of connectors being spaced a fixed distance from each other.

4. The arrangement of claim 3, the bus including one or more mechanical spacers.

5. The arrangement of claim 4, the bus including one or more terminals for attaching signal leads thereto.

6. The arrangement of claim 5, the signal being power.

7. The arrangement of claim 6, the power being negative 48 volts.

8. An arrangement comprising:
    a backplane having a front and a back, the backplane having a plurality of connectors affixed to the front, each connector arranged to accept a circuit board having a set of signal receptacles, each connector having a set of connector holes, the plurality of connectors thus forming a plurality of sets of connector holes, each set of connector holes positioned such that when a circuit board is mounted in the corresponding connector the set of connector holes aligns with the set of signal receptacles, the backplane having a plurality of backplane holes arranged in sets, thus forming a plurality of sets of backplane holes, each set of backplane holes being aligned with a set of connector holes, thus forming a plurality of sets of backplane holes and corresponding sets of connector holes; and, a bus formed of conductive material, the bus being elongated and having a length and affixed to the back of the backplane and including a plurality of sets of one piece prongs with the bus disposed along the length, each set of prongs aligned with a set of connector holes and corresponding set of backplane holes and extending therethrough to the front so that, when a circuit board is mounted in the corresponding connector, the set of prongs makes electrical contact with the set of signal receptacles.

9. The arrangement of claim 8, the backplane including at least three connectors.

10. The arrangement of claim 9, the plurality of connectors being spaced a fixed distance from each other.

11. The arrangement of claim 10, the bus including one or more mechanical spacers.

12. The arrangement of claim 11, each circuit board comprising four signal receptacles, each connector comprises four connector holes, each set of backplane holes comprises four backplane holes, and each set of conductive prongs comprises four conductive prongs.

13. The arrangement of claim 12, the bus including one or more terminals for attaching signal leads thereto.

14. The arrangement of claim 13, the signal being power.

15. The arrangement of claim 14, the power being negative 48 volts.

* * * * *